United States Patent
Ray

(10) Patent No.: US 6,940,079 B2
(45) Date of Patent: Sep. 6, 2005

(54) METHOD OF CORRECTION FOR WAFER CRYSTAL CUT ERROR IN SEMICONDUCTOR PROCESSING

(75) Inventor: Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/006,840

(22) Filed: Dec. 8, 2004

(65) Prior Publication Data

US 2005/0161619 A1     Jul. 28, 2005

Related U.S. Application Data

(62) Division of application No. 10/762,821, filed on Jan. 22, 2004.

(51) Int. Cl.[7] ............................................. B32B 3/02
(52) U.S. Cl. ................. 250/492.21; 414/935; 428/64.1
(58) Field of Search ................... 250/492.21; 414/935; 428/64.1; 257/797

(56) References Cited

U.S. PATENT DOCUMENTS

| | | | |
|---|---|---|---|
| 4,975,586 A | 12/1990 | Ray | |
| 5,876,819 A | * 3/1999 | Kimura et al. | ............. 428/64.1 |
| 6,255,662 B1 | 7/2001 | Rubin et al. | |

* cited by examiner

Primary Examiner—Nikita Wells
Assistant Examiner—Zia R. Hashmi
(74) Attorney, Agent, or Firm—Eschweiler & Associates, LLC

(57) ABSTRACT

The present invention is directed to accounting for crystal cut error data in ion implantation systems, thereby facilitating more accurate ion implantation. One or more aspects of the invention also consider possible shadowing effects that can result from features formed on the surface of a wafer being doped. According to one or more aspects of the invention, crystal cut error data and optionally feature data also are periodically fed forward in one or more ion implantation stages or systems to ascertain how to re-orient the ion beam with respect to the workpiece to achieve desired implantation results.

8 Claims, 9 Drawing Sheets

METHOD OF CORRECTION FOR WAFER CRYSTAL CUT ERROR IN SEMICONDUCTOR PROCESSING

RELATED APPLICATION

This application is a divisional of Ser. No. 10/762,821 filed Jan. 22, 2004, which is entitled "Method of Correction for Wafer Crystal Cut Error in Semiconductor Processing".

FIELD OF THE INVENTION

The present invention relates generally to ion implantation systems, and more particularly to accounting for wafer cut error as may affect ion implantation in semiconductor fabrication.

BACKGROUND OF THE INVENTION

Ion implantation systems are the mechanisms utilized to dope semiconductor substrates with dopants or impurities in integrated circuit manufacturing. In such systems, a dopant material is ionized and an ion beam is generated there-from. The ion beam is directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing one or more semiconductor wafers or workpieces to be implanted by the ion beam.

Ion implanters are advantageous because they allow for precision with regard to both quantity and placement of dopant within the silicon. In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions.

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions that strike the wafers to penetrate those wafers in the implantation chamber. Such selective implantation thus allows an integrated circuit to be fabricated.

However, while much thought and consideration is usually given to the orientation (e.g., tilt and/or twist, etc.) of the ion beam relative to the wafer, ion implantation systems generally orient the ion beam relative to the mechanical surface of a wafer, with little to no consideration given to variations between the wafer's internal lattice structure and its mechanical surface. Additionally, wafers are purchased with a nominal lattice structure relative to their mechanical surfaces. In particular, the wafers are designated with Miller Index data, such as 1,0,0, which is indicative of the relative orientation of the lattice structure to the cut surface of the wafer. However, imprecisions associated with the wafer manufacturing process can cause the actual orientation of the lattice structure to differ from this nominal value by up to a degree (e.g., "1,1,0"±Δ, ", 1,1,1"±Δ).

The actual orientation of the ion beam to the lattice structure of a wafer is important because it can affect channeling, and more particularly the repeatability of channeling, among other things. For example, in some situations it may be desirable to "align" the ion beam with the lattice structure so that few ions encounter the structure and the ions are thereby implanted relatively deeply into the substrate. Alternatively, it may be desirable to somewhat "misalign" the ion beam with the lattice structure so that some of the ions encounter some of the lattice structure and are blocked, slowed down or reflected thereby. In either instance, improper alignment can lead to undesired degrees of channeling (e.g., too little or too much). Additionally, the deviations from the nominal lattice orientation and the dimensions of features formed upon the wafer can affect shadowing, and adversely impact the implantation process and resulting devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to accounting for crystal cut error data in ion implantation systems, thereby facilitating more accurate ion implantation. One or more aspects of the invention also consider possible shadowing effects that can result from features formed on the surface of a wafer being doped. According to one or more aspects of the invention, crystal cut error data and optionally feature data also are periodically fed forward in one or more ion implantation stages or systems to ascertain how to re-orient the ion beam with respect to the workpiece to achieve desired implantation results.

According to one or more aspects of the present invention, a method of accounting for crystal cut error in an ion implantation system is disclosed. The method includes obtaining data relating to an orientation of a mechanical surface of a wafer relative to an ion beam directed at the surface of the wafer to implant ions within select locations thereof. The method also includes obtaining data regarding features formed upon the surface of the wafer, including respective spacings exiting between the features. Respective degrees of shading likely to result during ion implantation given the orientation of the ion beam and the feature data are then determined. What adjustments, if any, should be made to the orientation of the ion beam to adequately mitigate potential shadowing are then determined. Crystal cut error data relating to the orientation of the mechanical surface of the wafer relative to an actual lattice structure of the wafer is then obtained. The crystal cut error data is then used to determine the severity of channeling likely to result from the ion implantation given the orientation of the ion beam to the surface of the wafer and the orientation of the surface of the wafer to the lattice structure of the wafer. What adjustments, if any, should be made to the orientation of the ion beam to achieve desired channeling are then determined. It is then determined whether the proposed adjustments to mitigate shadowing and the proposed channeling adjustments are coincident. If these proposed adjustments do not coincide, then an acceptable re-orientation of the ion beam is determined. The orientation of the ion beam relative to the mechanical surface of the wafer is finally adjusted as needed, and the process can then continue on for further fabrication.

In accordance with one or more other aspects of the present invention, a method of accounting for crystal cut error in one or more ion implantation systems is disclosed. The method includes periodically feeding forward crystal cut error data associated with a wafer to one or more stages of one or more ion implantation systems through which the wafer is matriculating, where the crystal cut error data pertains to a variation between a nominal crystalline lattice structure and an actual crystalline lattice structure and a mechanical surface of the wafer. The method then proceeds to determine how to adjust an ion beam relative to the surface of the wafer to achieve desired ion implantation in light of the crystal cut error data.

According to one or more other aspects of the present invention, a method of implanting ions within a wafer with an ion beam is disclosed. The method includes obtaining crystal cut error data regarding a variation between a nominal crystalline lattice structure and an actual crystalline lattice structure and a mechanical surface of the wafer. The method also includes obtaining data regarding features formed upon the surface of the wafer, including respective spacings exiting between the features. The method finally includes adjusting the orientation of the ion beam relative to the surface of the wafer to adequately mitigate shadowing and achieve desired channeling in light of the crystal cut error data and the feature data.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 3 is a perspective view of an example of a portion of a lattice structure, such as that depicted in FIG. 1, wherein a mechanical surface of the structure is substantially co-planar there-with.

FIG. 4 is a perspective view of an example of a portion of a lattice structure, such as that depicted in FIG. 2, wherein a mechanical surface of the structure is not substantially co-planar there-with.

DETAILED DESCRIPTION OF THE INVENTION

Figure 1:
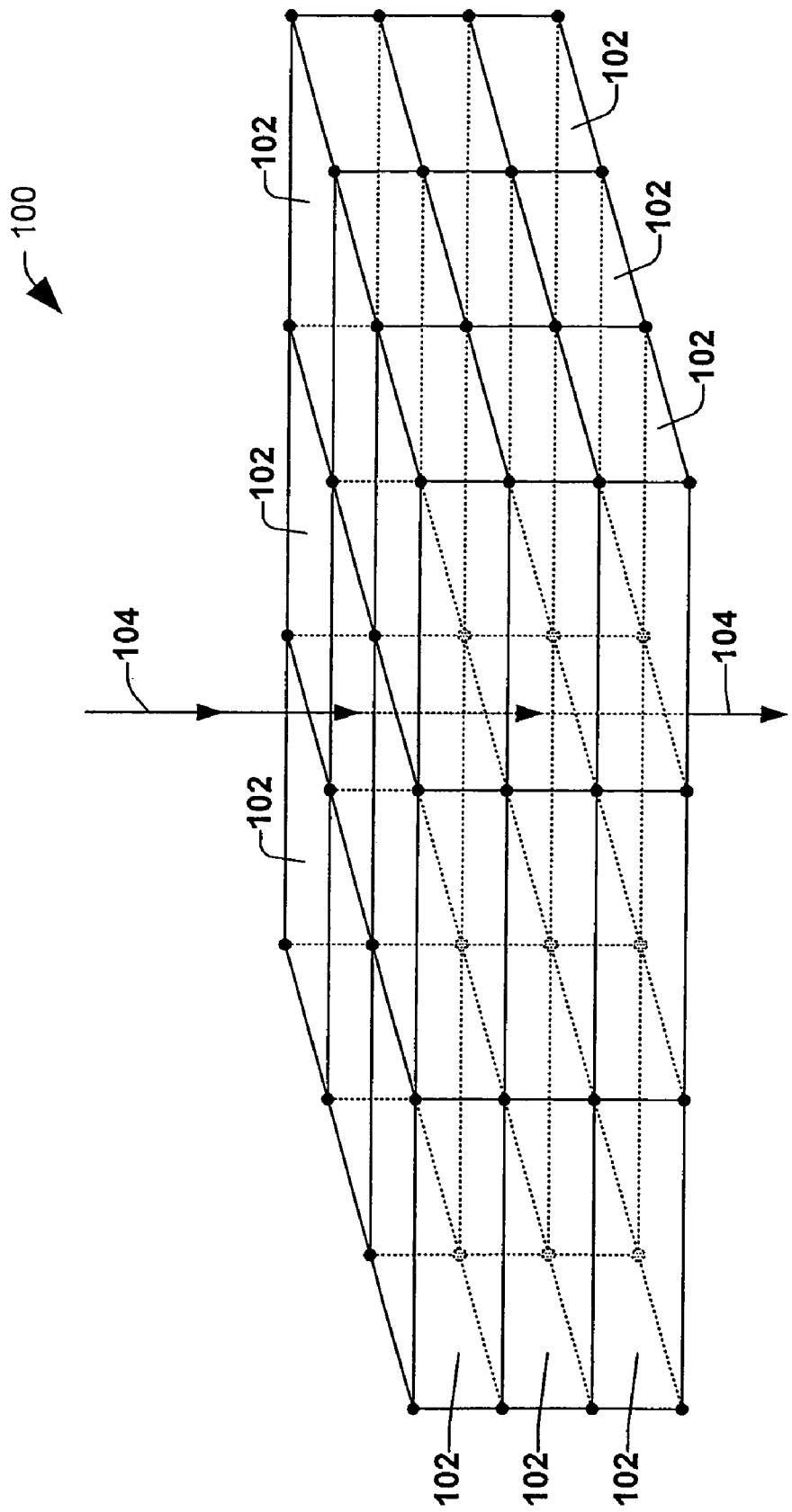
FIG. 1 is a perspective view of an example of a portion of a lattice structure wherein an ion beam is directed at the lattice structure at an angle substantially equal to ninety degrees.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention is directed to accounting for crystal cut error data in ion implantation systems, thereby facilitating more accurate ion implantation. One or more aspects of the invention also consider possible shadowing effects that can result from features formed on the surface of a wafer being doped. According to one or more aspects of the invention, crystal cut error data and optionally feature data also are periodically fed forward in one or more ion implantation stages or systems to ascertain how to re-orient the ion beam with respect to the workpiece to achieve desired implantation results.

As alluded to above, in semiconductor fabrication processing, semiconductor wafers are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

The base layers or substrate are generally composed of silicon because of its crystalline structure. Materials are said to have a crystalline structure when their atoms are arranged in three dimensions in a regular manner, known as a crystalline lattice. By way of example, FIG. 1 illustrates a portion of a generic lattice structure 100 having a generally cubic configuration. In particular, in the example illustrated, the lattice structure 100 has twenty-seven (e.g., three by three by three) cells 102 that are themselves all generally cubical in shape. It is to be appreciated, however, that lattice structures can come in any of a variety of different configurations and have any number of cells having any number of a variety of different shapes, such as diamond, pyramidal, hexagonal, etc.

The silicon base layers utilized in semiconductor fabrication are also referred to as wafers or substrates, at least in part, because they are cut from bulk silicon. In particular, very specific types of single crystals of silicon, known as boules, are grown into long lengths and thin slices (e.g., wafers) are cut there-from. The crystalline structure of the wafers is advantageous in electronic devices because it facilitates control of the electrical properties of the device and exhibits uniform electrical performance throughout the entire material. Additionally, because impurities that degrade device performance tend to collect around irregularities in the atomic structure of a material, the regularity of the crystalline structure provides for very favorable device performance and yield.

An important parameter of a semiconductor doping process is the angle of incidence between a beam of ions utilized to implant the dopant ions within the substrate and the internal lattice structure of the semiconductor material. The angle of incidence is important because it plays a role in a phenomenon known as channeling, among other things. In particular, as illustrated in FIG. 1, if the direction of the beam of dopant ions 104 is substantially perpendicular to a plane of the illustrated lattice structure, the beam may pass there-through without encountering many, if any, portions of the lattice structure. It should be understood that for different type lattice configurations, certain incident beam angles have a greater tendency for adverse channeling.

As such, the ions may, among other things, be implanted too deeply within the substrate, which can lead to undesirable electrical performance. It can be appreciated that other aspects can also affect channeling, such as the degree of amorphization of the substrate, the atomic mass of the substrate and the mass and/or energy of ions within the beam, for example. For instance, the greater the mass and/or energy of the ions within the beam 104, the more likely the ions may be implanted too deeply into the substrate.

Figure 2:
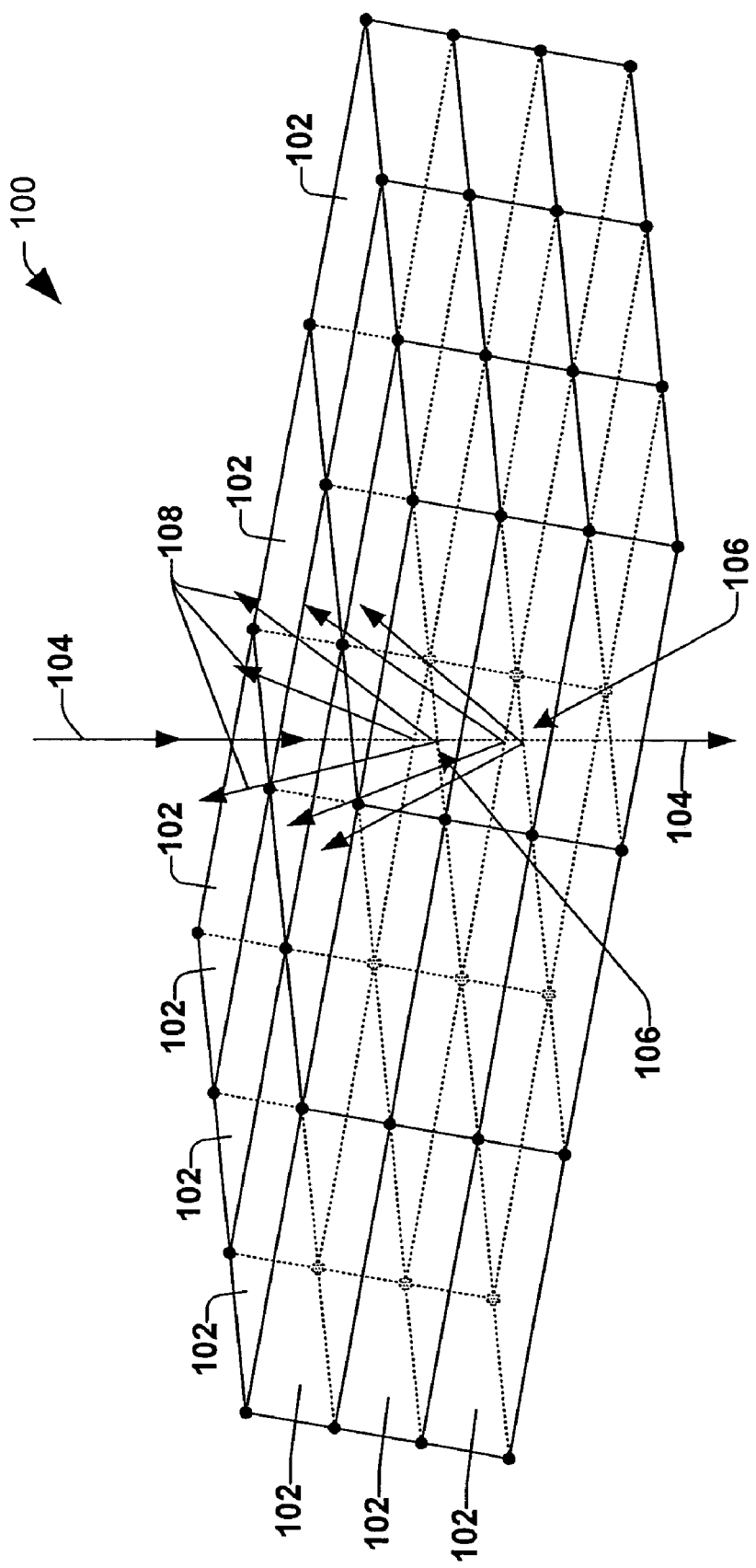
FIG. 2 is a perspective view of an example of a portion of a lattice structure, such as that depicted in FIG. 1, wherein an ion beam is directed at the lattice structure at an angle other than about ninety degrees.

In FIG. 2, for example, the direction of the beam 104 is not substantially perpendicular to a plane of the lattice structure 100. As such, some of the ions within the ion beam 104 will likely encounter portions 106 of the lattice structure and either lose energy and be slowed down thereby or be reflected or deflected away from these portions as indicated by arrows 108, and thereby coming to rest in shallow portions of the implanted material. As such, it may be desirable to direct the ion beam at an angle slightly other than ninety degrees to the lattice structure 100 to avoid substantial channeling and/or other adverse implantation outcomes.

Figure 3:
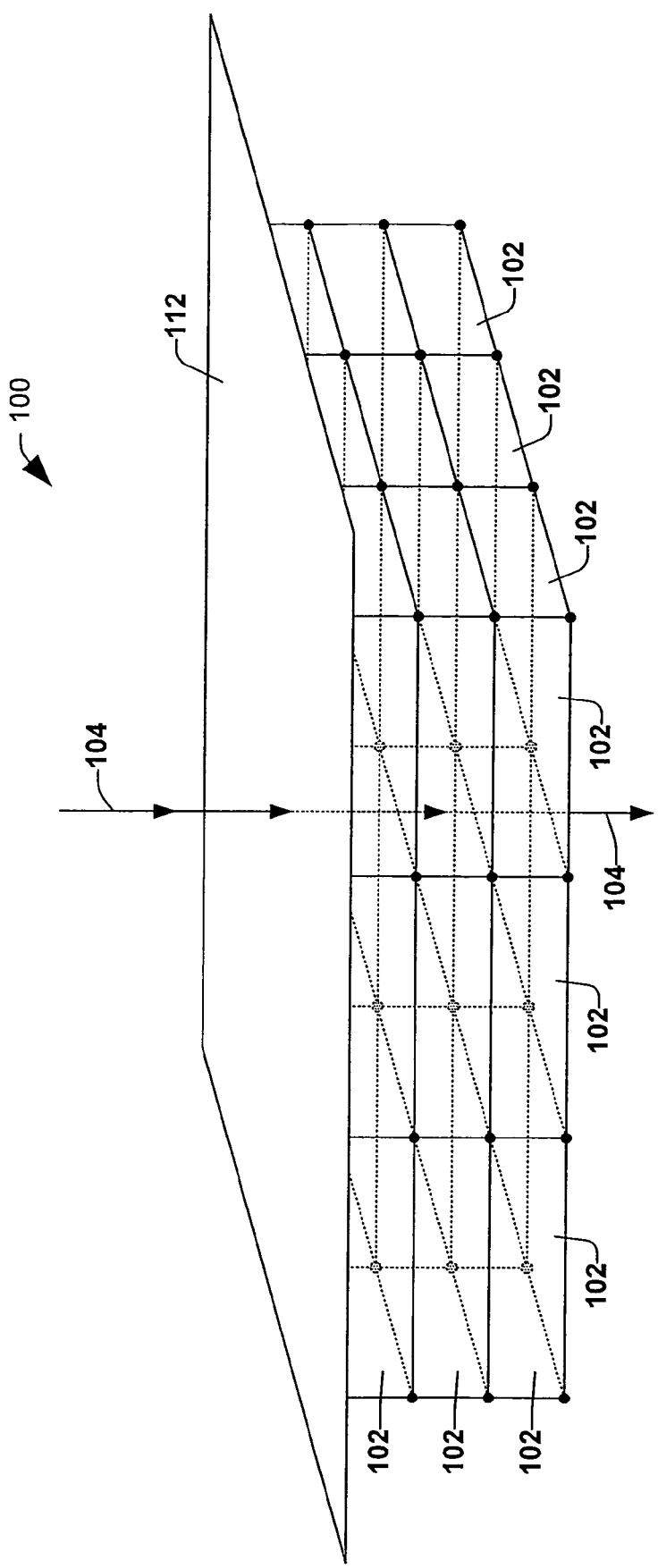

Nevertheless, the ion beam is usually calibrated or oriented relative to a mechanical surface of the wafer and a nominal orientation of the lattice structure to the surface of the wafer, rather than variations from the nominal, and the surface of the wafer may or may not be appropriately aligned with the lattice structure due to imprecisions associated with slicing the wafer from the boule, among other things. By way of example, FIG. 3 illustrates a situation wherein the wafer has been sliced such that the mechanical surface 112 thereof is substantially co-planer with a plane of the lattice structure 100. In this arrangement, the relationship (e.g., angle of implantation) between the beam 104 and the surface 112 of the wafer, which is correlated to the lattice structure 100, can be relatively carefully controlled or adjusted to achieve desired doping concentrations, locations, etc. In the above manner, semiconductor manufacturers typically order silicon starting material with a specific lattice orientation (e.g., "1,1,0" or "1,1,1" starting material).

Figure 4:
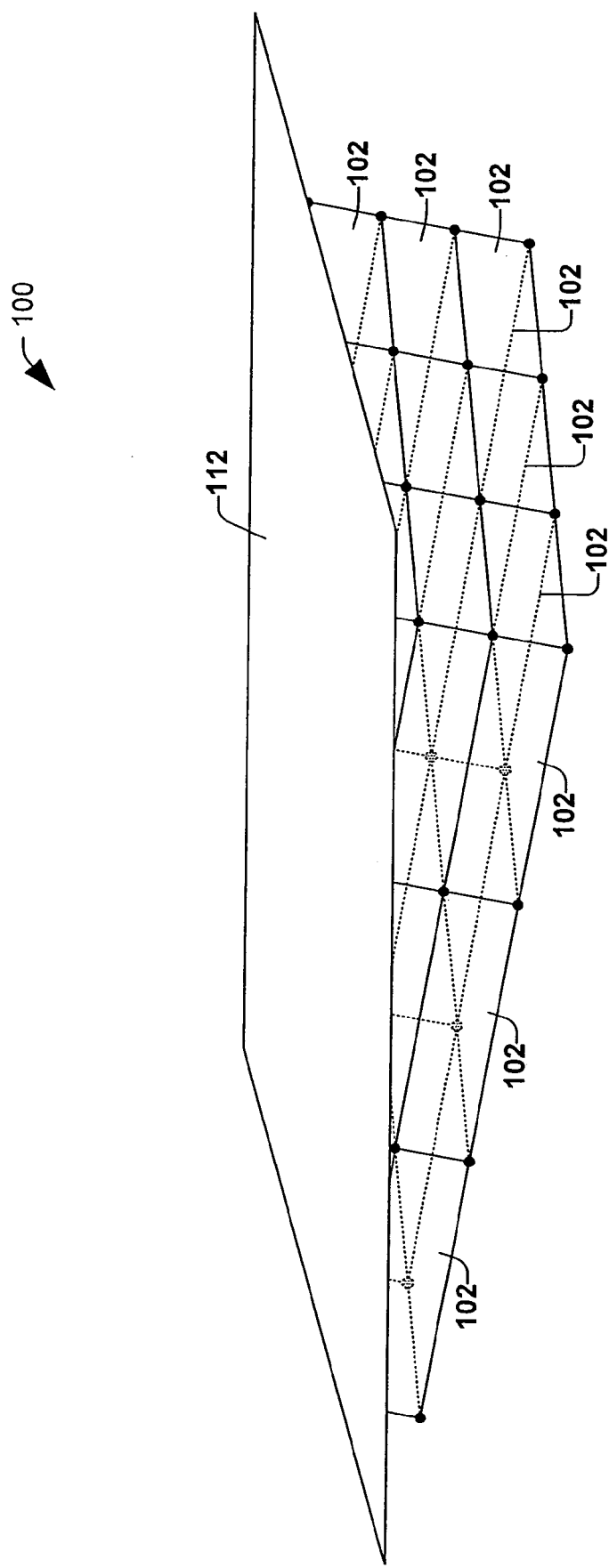

FIG. 4 depicts a different situation where the wafer has been sliced from the boule such that the mechanical surface 112 thereof is not substantially co-planer with a plane of the lattice structure 100. In this manner, there can be said to be some "crystal cut error" where crystal cut error is generally defined as the variation between the crystalline lattice structure 100 and the mechanical surface 112 of the wafer. Alternatively or in addition, crystal cut error may comprise deviations between the nominal lattice structure (e.g., "1,1, 0" or "1,1,1"), such as may be provided by a wafer supplier, and the actual orientation of the lattice structure relative to the mechanical surface of the wafer. Such deviations (e.g., "1,1,0"±Δ, "1,1,1"±Δ) can vary by about +1–2° or more, for example. Thus, it can be appreciated that the greater the crystal cut error, the more difficult it becomes to establish a predictable and desired orientation between the ion beam 104 and the lattice structure 100. As such, it becomes more and more difficult to attain reliable, predictable and desirable electrical performance.

In addition to the above mechanisms, crystal cut error may also include a rotational components. For example, wafers have an identifying feature at the edge thereof (e.g., a small notch or flat) that identifies the X-Y orientation of the crystal in a rotational context. Correction of a combination of these errors may require adjusting the tilt of the wafer, the twist of the wafer, or both, as will be described in greater detail below.

Accordingly, it can be appreciated that it would be desirable to implant ions at a slight angle to mitigate channeling effects while also taking into account, among other things, crystal cut error. Nevertheless, a continuing trend in the electronics industry is to scale down electronic devices to produce smaller, yet more powerful devices (e.g., cell phones, digital cameras, etc.) that can perform a greater number of increasingly complex functions with less power. To achieve this, semiconductors and integrated circuits (e.g., transistors, etc.) utilized in these devices are continually reduced in size. The ability to "pack" more of these devices onto a single semiconductor substrate, or portion thereof (known as a die) also improves fabrication efficiency and yield.

To increase packing density, features formed in and on a wafer as part of the semiconductor fabrication process are formed closer together, and the spacings established between such features are correspondingly made more narrow. However, the respective heights of some of the features generally do not change since these features are typically formed out of a resist material employed as part of a photolithographic process.

In particular, photolithography is a process that is commonly used in semiconductor fabrication to transfer one or more patterns onto/into one or more layers overlying the substrate and/or to facilitate doping of the substrate and/or one or more other layers. The generally fixed height of the resist features coupled with the shrinking spacings between these features can, however, result in increased shadowing effects (when angled implants are utilized), whereby portions of the wafer that are to be doped receive little to no dopant ions. Such shadowing can become more exaggerated where an ion implantation angle is increased, such as to diminish channeling, for example. Accordingly, a balance may have to be struck between mitigating channeling and shadowing effects.

Figure 5:
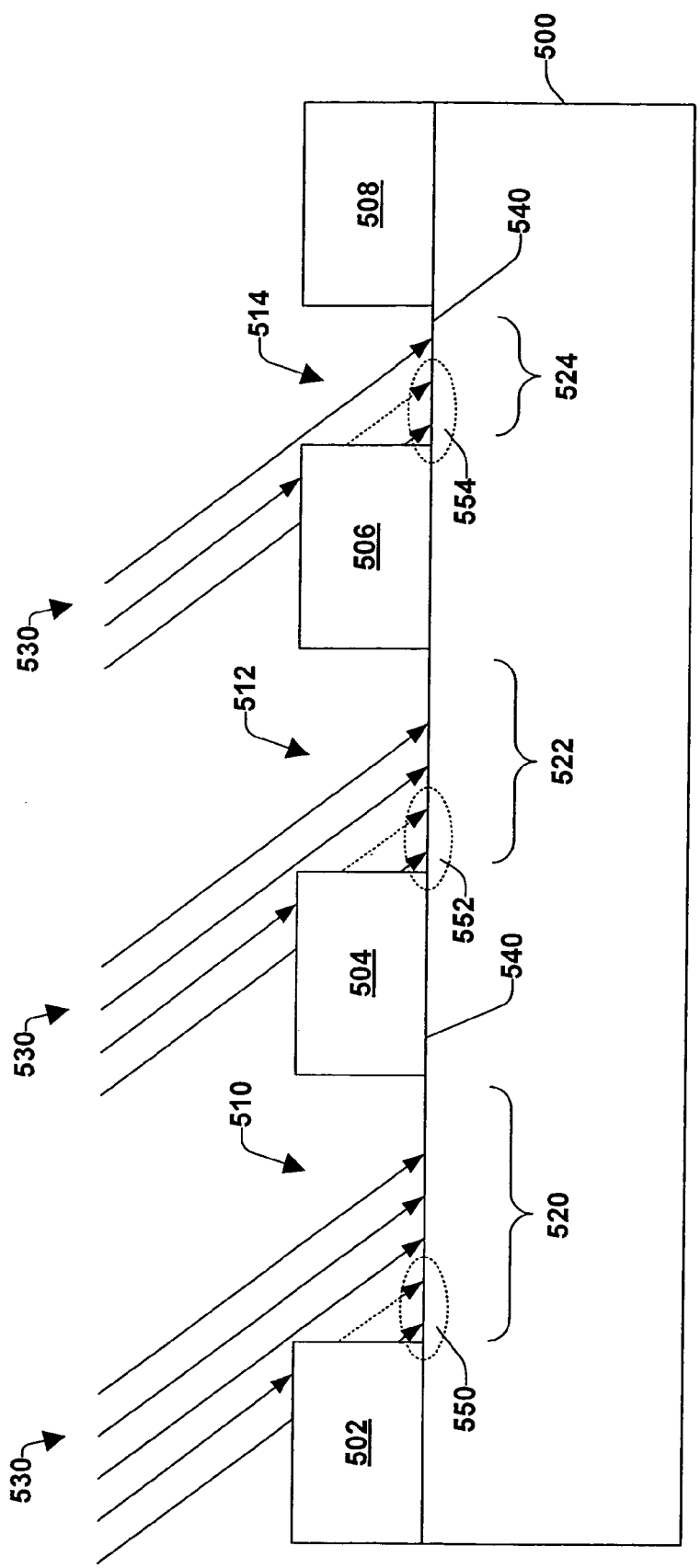
FIG. 5 is a cross-sectional side view of a portion of a semiconductor substrate or wafer having features formed thereon that are separated by varying distances and that experiences shadowing effects to varying degrees during ion implantation.

Turning to FIG. 5, for example, a cross sectional view of a portion of a semiconductor substrate or wafer 500 has a plurality of features 502, 504, 506, 508 formed thereon, and respective spacings 510, 512, 514 are defined there-between. The features 502, 504, 506, 508 are formed out of a resist material and thus are all of substantially the same height. Some of the resist features 502, 504, 506, 508 are, however, formed closer together than others, and thus the corresponding spacings 510, 512, 514 there-between are of different widths.

Areas 520, 522, 524 of the substrate 500 exposed by the spacings 510, 512, 514 are to be doped via ion implantation. Accordingly, one or more ion beams 530 are directed at the substrate 500 to perform the doping. The beams 530 are, however, oriented at an angle with respect to a surface 540 of the substrate 500 to mitigate channeling effects, for example. Some of the beams 530 thus have some of their ions blocked by portions (e.g., corners) of the features 502, 504, 506, 508. As such, regions 550, 552, 554 within the substrate areas 520, 522, 524 receive less than intended amounts of dopant ions. It can be seen that as the features 502, 504, 506, 508 are brought closer together and the respective spacings 510, 512, 514 are thereby made more narrow, the insufficiently doped regions 550, 552, 554 make up larger and larger portions of the substrate areas 520, 522, 524. Accordingly, adverse effects associated with shadowing can become exaggerated as attempts are made to increase packing densities while accounting for channeling effects.

Thus, since the ion beams are generally calibrated or oriented relative to the mechanical surface of the wafers, they do not take into account wafer crystal cut error or the relationship between the mechanical surface of the wafer and the lattice structure of the wafer. Accordingly, channeling effects can unpredictably present themselves, adversely affecting device performance and product yield. Further, ion implanters in some cases are limited in an extent to which angled implants can be employed to reduce channeling due to the increasing negative impact of shadowing due to such angled implants.

Figure 6:
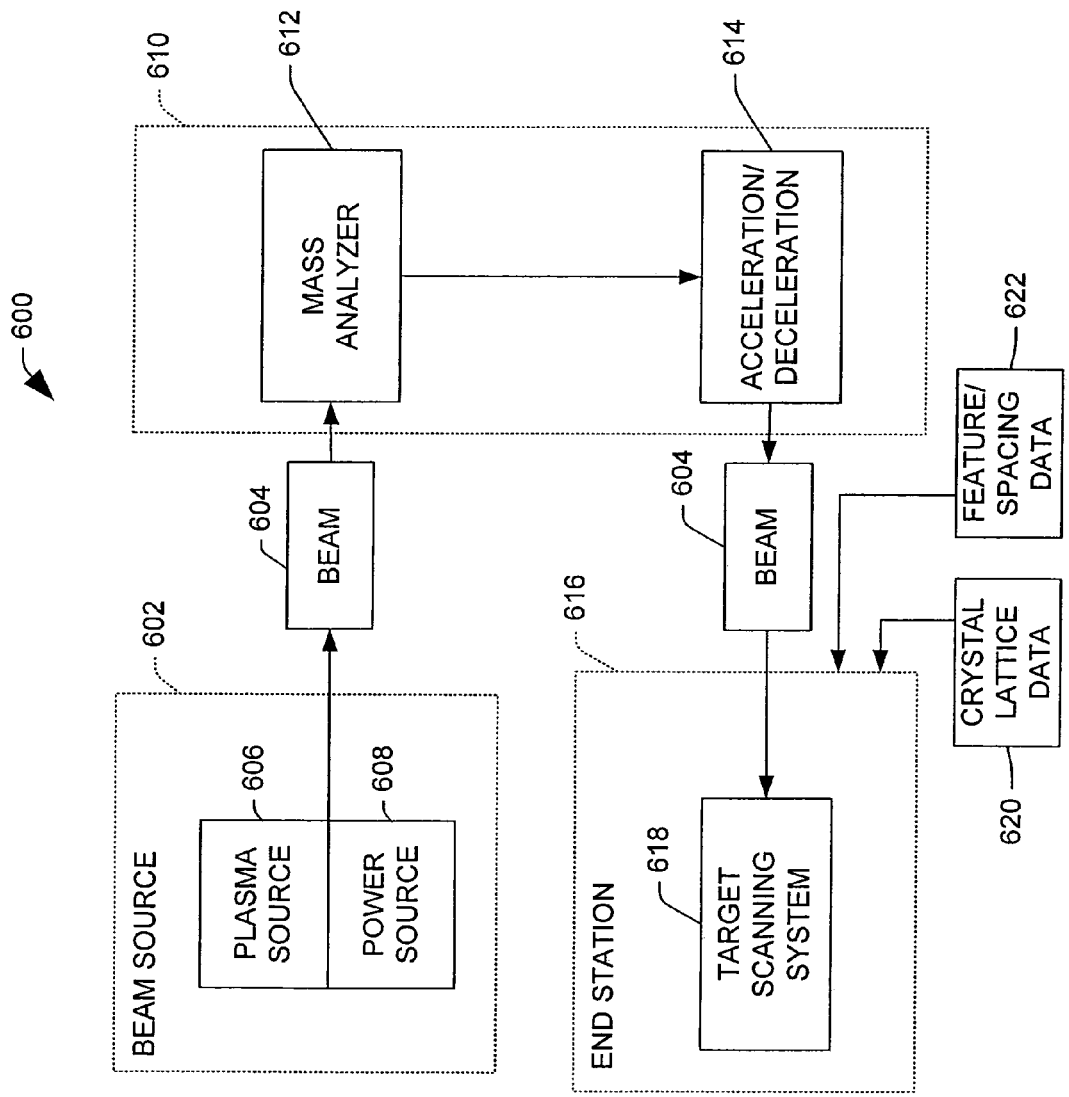
FIG. 6 is a schematic block diagram of an ion implantation system suitable for use according to one or more aspects of the present invention.

Referring to FIG. 6, an ion implantation system 100 suitable for accounting for wafer crystal cut error and shadowing effects according to one or more aspects of the present invention is depicted in block diagram form. The system 600 includes an ion source 602 for producing an ion beam 604 along a beam path. The ion beam source 602 includes, for example, a plasma source 606 with an associated power source 608. The plasma source 606 may, for example, comprise a relatively long plasma confinement chamber from which an ion beam is extracted.

A beamline assembly 610 is provided downstream of the ion source 602 to receive the beam 604 therefrom. The beamline assembly 610 includes a mass analyzer 612 as well as an acceleration/deceleration structure 614. The beamline assembly 610 is situated along the path to receive the beam 604. The mass analyzer 612 includes a field generating component, such as a magnet (not shown), and operates to provide a field across the beam path so as to deflect ions from the ion beam 604 at varying trajectories according to mass (e.g., charge to mass ratio). Ions traveling through the magnetic field experience a force which directs individual ions of a desired mass along the beam path and which deflects ions of undesired mass away from the beam path.

The acceleration/deceleration component 614 may include one or more gaps that are operable to accelerate and/or decelerate ions within the beam to achieve a desired depth of implantation in a workpiece or wafer, as well as to decontaminate the beam by bending the beam and separating out contaminating neutral particles from the beam. The gaps may also be operable to focus or otherwise manipulate the beam 604. Further, such gaps may be applied before as well as after the magnetic analysis by the mass analyzer 612.

An end station 616 is also provided in the system 600 to receive the mass analyzed decontaminated ion beam 604 from the beamline assembly 610. The end station 616 supports one or more workpieces (single wafer or a batch system) such as semiconductor substrates (not shown) along the beam path for implantation using the mass analyzed decontaminated ion beam 604. The end station 616 includes a target scanning system 618 for translating or scanning one or more target workpieces and the ion beam 604 relative to one another. The target scanning system 618 may provide for batch or serial implantation, for example, as may be desired under given circumstances, operating parameters and/or objectives. It is to be appreciated that reference to substrate or semiconductor substrate as used throughout this document is intended to include a base semiconductor wafer (e.g., silicon, SiGe, or an SOI wafer) and any epitaxial layers or other type semiconductor layers formed thereover or associated therewith, as well as other type workpieces suitable for implantation.

In accordance with one or more aspects of the present invention, crystal cut error data 620 relating to respective variations between the nominal crystalline lattice structures and the actual crystalline lattice structures and the mechanical surfaces of the wafers is fed (forward) into the system 600, and more particularly into the end station 616 in the illustrated example. Similarly, feature dimension (e.g., height, thickness, etc.) and/or corresponding spacing width data 622 is also fed into the end station 616. The end station 616, and more particularly a processor (not shown) of the target scanning system 618 utilizes this data to maneuver, (re)orient and/or align the one or more workpieces relative to the beam 604 to achieve desired doping (e.g., concurrent mitigation of channeling and shadowing). It is to be appreciated, however, that the data 620 relating to the crystal cut and/or the data 622 relating to the feature and spacing dimensions can be imparted to any one or more components of the system 600 to facilitate desired doping. For instance, the acceleration/deceleration component 614 of the beamline assembly 610 may also receive this data and a processor (not shown) situated therein may selectively maneuver or otherwise manipulate the beam 604 in response thereto to achieve desired doping.

It will be appreciated that such silicon crystal cut 620 and feature 622 data may be provided from any of a variety of sources. By way of example, the nominal lattice orientation may be obtained from a wafer supplier. Similarly, a separate or stand-alone tool, or the same or different implanter system that can perform one or more measurements that detail the orientation of the silicon crystal lattice relative to the mechanical surface of the wafer (e.g., via Rutherford backscattering, x-ray diffraction, crystallography, etc.) can be utilized to provide (e.g., upload) the crystal cut data 620 to the system 600. An exemplary implementation of Rutherford backscattering to ascertain actual lattice orientation is set forth is U.S. Pat. No. 6,255,662 to Rubin et al., the entirety of which is hereby fully incorporated by reference. Similarly, dimension data 622 can be provided to the system 600 according to design specifications, design rules, etc. established for one or more of the semiconductor devices being fabricated upon the wafers.

It will also be appreciated that such crystal lattice data 620 may only have to be uploaded to the system 600 once for multiple wafers that are cut at the same orientation/angle from a single boule since these wafers are likely to have similar, if not identical, lattice structures relative to their respective mechanical surfaces. Alignment accuracy for such wafers may, however, be periodically verified, or even improved, by uploading new lattice data to the system 600 at increments of about every couple of wafers being processed. This may be done, for example, to account for lattice variations that may result from warping or other deformities experienced by a single boule.

Periodic lattice data updates may also serve to account for lattice variations that can be attributed to drifting of the instrument utilized to cut the wafers from the boule. In such a scenario, the angle between the lattice structure and the respective mechanical surfaces of the wafers may gradually change, eventually having a significant or measurable impact on ion implantation. Additionally, since lattice structures generally differ from boule to boule, new crystal lattice data 620 should also be uploaded to the system 600 whenever new wafers are processed that originate from different boules. Similarly, updated data should also be directed to the system 600 whenever wafers are cut from the same boule, but at substantially different angles or orientations (e.g., to obtain wafers of different dimensions).

Figure 7:
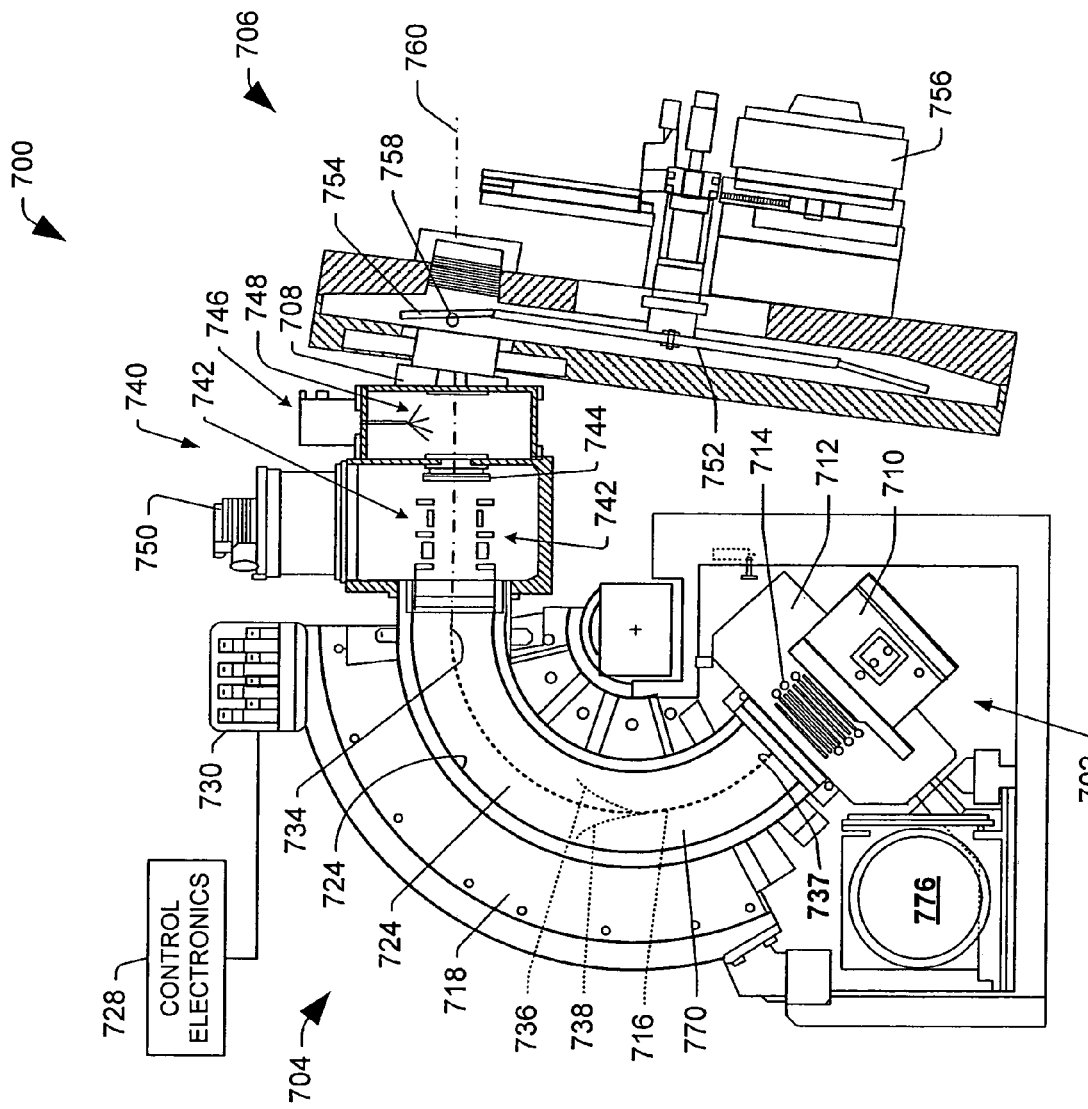
FIG. 7 is another illustration of an ion implantation system, but in somewhat greater detail than that depicted in FIG. 7, suitable for implementing one or more aspects of the present invention.

Referring now to FIG. 7, an exemplary low energy ion implantation system 700 suitable for implementing one or more aspects of the present invention is depicted in somewhat greater detail. The system 700 includes an ion source 702, a beamline assembly 704, and a target or end station 706. An expansible stainless steel bellows assembly 708, which permits movement of the end station 706 with respect to the beamline assembly 704, connects the end station 706 and the beamline assembly 704.

The ion source 702 comprises a plasma chamber 710 and an ion extractor assembly 712. Energy is imparted to an ionizable dopant gas to generate ions within the plasma chamber 710. Generally, positive ions are generated, although the present invention is applicable to systems wherein negative ions are generated by the source 702. The positive ions are extracted through a slit in the plasma chamber 710 by the ion extractor assembly 712, which comprises a plurality of electrodes 714. Accordingly, the ion extractor assembly 712 functions to extract a beam 716 of positive ions from the plasma chamber 710 and to accelerate the extracted ions into the beamline assembly 704, and more particularly into a mass analysis magnet 718 within the beamline assembly 704.

The mass analysis magnet 718 includes a curved beam path 720 within a passageway 722 defined by a metal (e.g., aluminum) beam guide having side walls 724, evacuation of which is provided by a vacuum pump 726. The ion beam 716 that propagates along this path 720 is affected by the magnetic field generated by the mass analysis magnet 718, to reject ions of an inappropriate charge-to-mass ratio. The strength and orientation of this dipole magnetic field is controlled by control electronics 728 which adjust the electrical current through the field windings of the magnet 718 through a magnet connector 730.

The dipole magnetic field causes the ion beam 716 to move along the curved beam path 720 from a first or entrance trajectory 732 near the ion source 702 to a second or exit trajectory 734 near an exiting end of the passageway 722. Portions 736 and 738 of the beam 716, comprised of ions having an inappropriate charge-to-mass ratio, are deflected away from the curved trajectory and into the beam guide side walls 724. In this manner, the magnet 718 only allows those ions in the beam 720 which have the desired charge-to-mass ratio to traverse entirely through the passageway 722.

The beamline assembly 704 can also include an accelerator 740 that has a plurality of electrodes 742 arranged and biased to accelerate and/or decelerate ions, as well as to focus, bend and decontaminate the ion beam. A dosimetry indicator such as a Faraday flag 744 may also be included to detect a sample current of the ion beam. A source of plasma 746 may also be included to provide a plasma shower 748 for neutralizing a (positive) charge that would otherwise accumulate on a target workpiece as a result of being implanted by the (positively) charged ion beam 716. A vacuum pump 750 may further be included to evacuate the accelerator 740.

Downstream of the accelerator 740 is the end station 706, which includes a support 752 upon which one or more wafers 754 or other workpieces to be treated are mounted. The wafer support 752 resides in a target plane which is generally perpendicularly oriented to the direction of the implant beam, which orientation may, however, be adjusted pursuant to crystal cut and/or feature dimension data as provided herein. The wafer support may also, for example, take the form of a mechanical arm capable of moving a wafer through the beam or a rotating disk. In the illustrated example, a disc shaped wafer support 752 is depicted, and is rotated by a motor 756 at the end station 706. The ion beam thus strikes wafers mounted to the support as they move in a circular path. The end station 706 pivots about point 758, which is the intersection of the path 760 of the ion beam and the wafer 754, so that the target plane is adjustable about this point 758.

By way of example, to adjust the ion beam in response to a detected wafer lattice orientation, the dimensions (e.g., width, height, etc.) of resist features and spacings therebetween can be considered relative to a proposed angle of ion implantation, and a determination can be made as to what degree of shadowing may result there-from. A determination can then be made as to whether this shadowing is excessive and, thus, to what degree, if any, the angle of implantation should be altered in response thereto. The implantation angle can be adjusted, for example, to bring the degree of shadowing to within some predefined tolerances or ranges depending upon the semiconductor devices being fabricated, performance specifications and acceptable failure rates, for example.

This proposed angle of implantation can then be checked against crystal cut error data to see if it is acceptable. For, example, given that the angle of implantation is measured against the mechanical surface of the wafer, the variation between the lattice structure of the wafer and the mechanical surface of the wafer can be provided to the system or be ascertained thereby (e.g., via Rutherford backscattering) and considered to find an orientation of the ion beam relative to the crystalline lattice structure. A determination can then be made as to what level of channeling is likely to result there-from and whether this is acceptable or unacceptable. If the degree of channeling is too great, further calculations can be made to ascertain how the wafer and ion beam should be re-oriented relative to one another to bring the degree of channeling to within acceptable levels. This new beam to wafer "anti-channeling" orientation can then be checked back against the proposed "anti-shadowing" angle to see if the two are sufficiently coincident.

If the implantation angle for mitigating shadowing is too different from the angle for mitigating channeling, the process can be iteratively repeated until an acceptable or "best fit" beam to wafer orientation is arrived at that accommodates both channeling and shadowing considerations. It will be appreciated that the respective significances of channeling and shadowing may differ depending upon many factors associated with the fabrication process, such as the types of devices being formed, acceptable levels of reliability and failure rates, performance requirements, etc. Accordingly, aspects of the crystal cut error data and feature data can be weighted according to one or more of these or other factors to reconcile differences in the proposed implantation angles. This alleviates the likelihood of getting bogged down in excessive calculations and/or stuck in a loop.

It will be appreciated that interpolation can, for example, be utilized in arriving at a satisfactory implant angle in conjunction with one or more data stores that correlate, among other things, acceptability/unacceptability of certain levels of channeling and/or shadowing given particular product performance parameters, failure rate tolerances, etc., as well as various degrees of channeling and/or shadowing as a function of crystal cut data, spacing and feature data, implantation angle data, etc. Further, technologies associated with facilitating unconstrained optimization (e.g., back-propagation, Bayesian, Fuzzy Set, Non Linear regression, or other neural network paradigms including mixture of experts, cerebellar model arithmetic computer (CMACS), Radial Basis Functions, directed search networks, and functional link nets) can also be implemented in arriving at a desirable angle of implantation.

It will be appreciated that the best (e.g., least expensive, least complex, most efficient) manner to adjust the beam to wafer orientation can also be determined. By way of example only, and not limitation, if a single wafer is mounted on the wafer support 752 for doping, then one or more components within the beamline assembly 704 may be selectively controlled to adjust the angle of implantation. If, on the other hand, multiple wafers are mounted on the wafer support 752, then one or more components of both the beamline assembly 704 and the end station 706 can, for example, be selectively adjusted to achieve a desired implantation result. Alternatively, one or more components of only the end station 706 may, for example, be selectively adjusted to (re)orient a workpiece relative to the beam 716.

Figure 8:
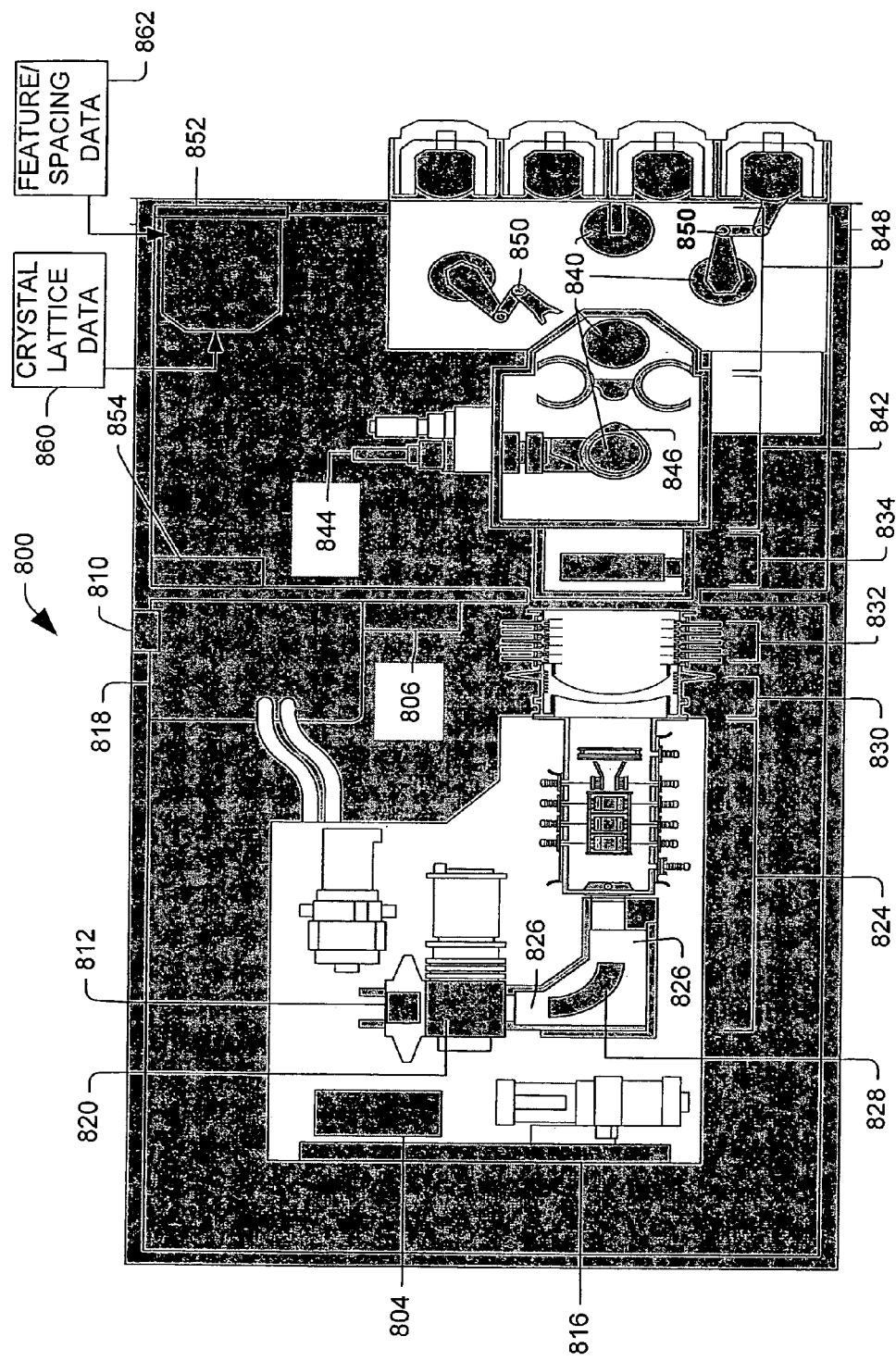
FIG. 8 depicts yet another ion implantation system suitable for use in accordance with one or more aspects of the present invention.

FIG. 8 illustrates yet another medium energy ion implantation system 800 suitable for implementing one or more aspects of the present invention. The system 800 includes a modular gas box 804, an auxiliary gas box 806 and a gas box remote purge control panel 810. The gas boxes 804, 806 comprise, among other things, one or more gases of a dopant substance, and the boxes 804, 806 facilitate selective delivery of the gas(es) into an extended life ion source 812 within the system 800, wherein the gas(es) can be ionized to generate ions suitable for implantation into wafers or workpieces selectively brought into the system 800. The gas box remote control panel 810 facilitates venting or purging gas(es) or other substances out of the system 800 on an as needed or desired basis.

High voltage terminal power distribution 816 and a high voltage isolation transformer 818 are included to, among other things, electrically excite and impart energy to the dopant gas(es) to generate ions from the gas(es). An ion beam extraction assembly 820 is included to extract ions from the ion source 812 and accelerate them into a beamline assembly 824, which includes a mass analysis magnet 826. The mass analysis magnet 826 is operable to sort out or reject ions of an inappropriate charge-to-mass ratio. In particular, the mass analysis magnet 826 comprises a beamguide 828 having curved sidewalls into which ions of an undesired mass-to-charge ratio collide as they are propagated through the beamguide 828 by way of one or more magnetic fields generated by magnet(s) of the mass analysis magnet 826.

According to one or more aspects of the present invention, a component may be included to assist with controlling the angle of the scanned ion beam. This may include, among other things, a scan angle correction lens 830. Additionally, an acceleration/deceleration column 832 may be included to assist with controlling and adjusting the speed, and/or focusing, of ions within the ion beam. A component 834 operable to filter out contaminant particles, such as a final energy filter, may also be included within the system 800.

Wafers or workpieces 840 are loaded into an end station chamber 842 for selective implantation with ions. A mechanical scan drive 844 maneuvers the wafers within the chamber 842 to facilitate selective encounters with the beam(s). The scan drive may, for example, maneuver a workpiece holder 846 that holds one or more wafers 840 (e.g., for serial implants) about one or more axes to facilitate an unlimited number of implantation angles. The wafers or workpieces 840 are moved into the end station chamber 842 by a wafer handling system 848, which may include, for example, one or more mechanical or robotic arms 850.

An operator console 852 allows an operator to regulate the implantation process by selectively controlling one or more components of the system 800. Finally, a power distribution box 854 is included to provide power to the overall system 800. U.S. Pat. No. 4,975,586 to Ray discloses an exemplary end station 842 and components thereof in slightly greater detail, where the end station has a wafer support or holder that is maneuverable about multiple axes. The entirety of this patent is thus hereby fully incorporated by reference.

Crystal cut data 860 relating to the angle or orientation of the lattice structures of the wafers relative to the respective mechanical surfaces of the wafers can, for example, be entered into the system 800 via the operator console 852. Alternatively, such data 860 can reside within a central or local computer and be downloaded therefrom to the tool. Similarly, feature dimension and corresponding spacing data 862, as well as any other relevant data, can also be entered into the system 800 via the operator console. The console 852 may, for example, have a computer or other processing type component that can utilize the data and adjust one or more components of the system 800 in response thereto.

In particular, the adjustments can be made to achieve a desired implantation angle between the ion beam and the surface of the wafers to achieve a desired level of doping, considering the respective orientations of the lattice structures of the wafers relative to the mechanical surfaces of the wafers, as well as the dimensions of features and spacings there-between. The somewhat competing interests of the respective tolerances for channeling and shadowing effects can also be resolved in making the determination of how to appropriately adjust the implantation process. It will be appreciated that consideration can also be given to ion energies, velocities, masses, species, etc. in adjusting the wafer to beam orientation. By way of example, the mechanical scan drive 844, one or more components of the beamline assembly 824, acceleration/deceleration column 832 and/or correction lens 830 can be selectively controlled, either alone or in combination, to adjust the relative orientation of one or more of the wafers 840 to the ion beam.

It will be appreciated that an original orientation of the beam to one or more of the wafers is generally known and, thus, a determination need not be made in that regard to provide a baseline orientation from which adjustments can be made. Additionally, or in the alternative, the position (e.g., tilt, twist, etc.) of the workpiece holder 846 is generally known (e.g., tracked and/or controlled by the scan drive 844), and the path of the beam is generally known. Since the wafers 840 basically reside flat against the holder 846, the respective orientations of the wafers to the beam are thus also generally known. It will be appreciated that in situations where multiple wafers reside on the holder 846 at different locals, the respective orientations of the wafers to the beam may also be known, provided the respective locals of the wafer on the holder 846 are tracked. Nevertheless, the present invention does, however, contemplate a mechanism to determine wafer orientation. Such an article may, for example, implement Rutherford backscattering, x-ray diffraction and/or crystallography to ascertain a wafer orientation relative to the ion beam. By way of example, the article may operate utilizing Rutherford backscattering as set forth in the aforementioned U.S. Pat. No. 6,255,662 to Rubin et al.

Figure 9:
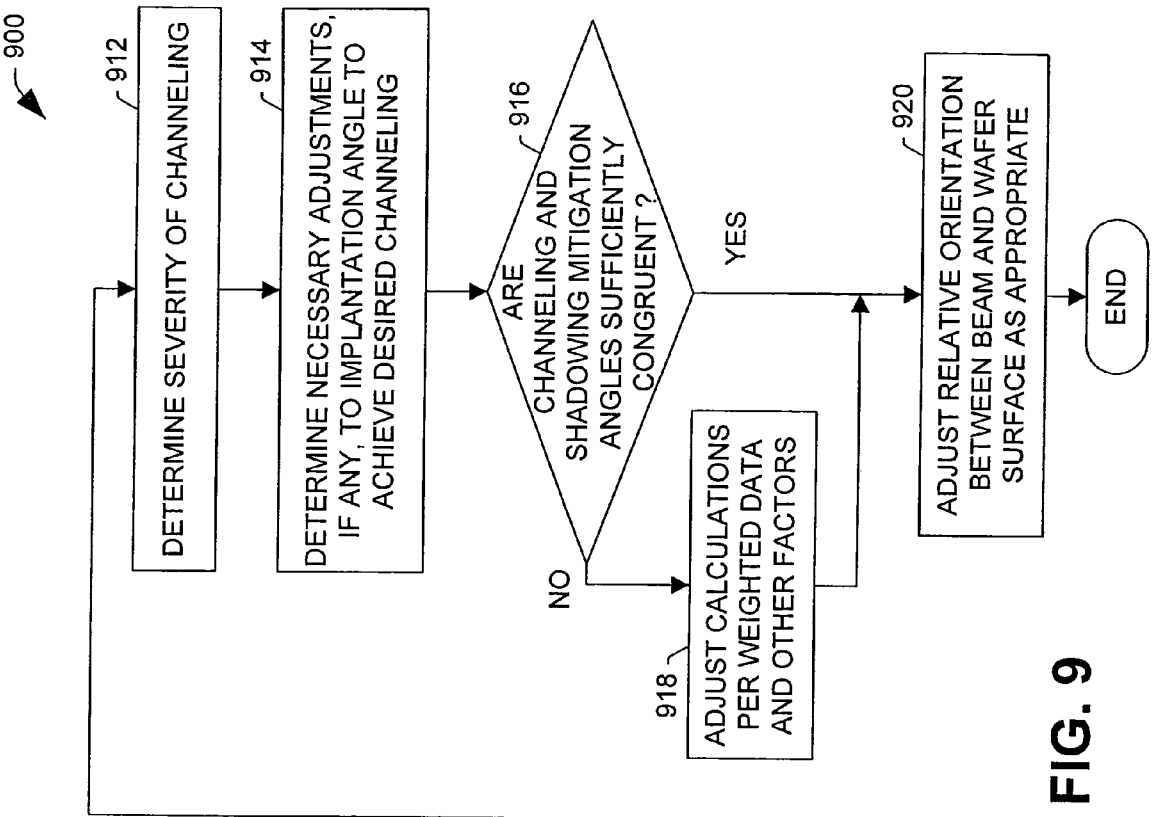
FIG. 9 is a is a flow diagram illustrating a method for accounting for wafer crystal cut error during ion implantation in semiconductor fabrication according to one or more aspects of the present invention.
Figure 9:
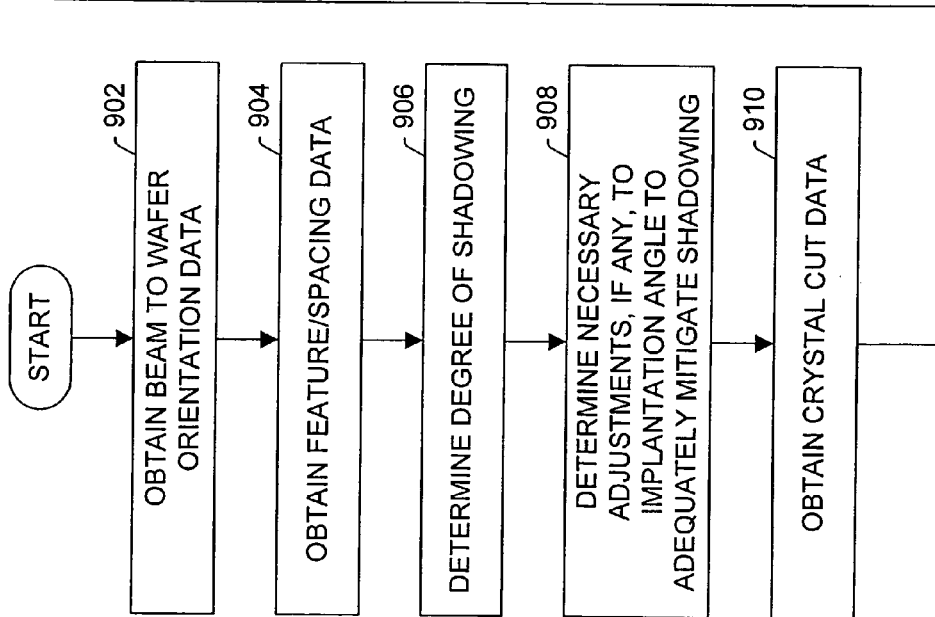

Referring now to FIG. 9, an exemplary methodology 900 is illustrated for doping or implanting ions within a semiconductor substrate while considering channeling and/or shadowing effects that can be detrimental to resulting device performance. The methodology serves to account for variations between the mechanical surface of the wafer and the crystalline lattice structure of the wafer which can affect channeling, while also accounting for resist feature dimensions and corresponding spacings there-between, which can play a role in shadowing. Although the methodology 900 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The methodology begins at 902 wherein an ion beam to wafer orientation or angle is obtained. As mentioned above, this is generally known since the angle of the beam is known and the position of a wafer or workpiece holder, as well as the location of one or more wafers situated thereon, is known. At 904, data regarding the dimensions of features formed upon the substrate, and in particular features formed out of a resist material patterned as part of a photolithography process, is obtained. This data includes information about spacings existing between such features, such as the respective sizes (e.g., widths) thereof. This data can, for example, be provided from design rules, specifications, etc. for semiconductor devices that are to be formed out of and/or upon the semiconductor substrate.

At 906, the degree of shadowing that is likely to occur given the angle of the ion implantation beam relative to the features formed upon the wafer and the dimensions of the features and the relative spacings existing there-between is ascertained. Then, at 908 a determination is made regarding what adjustments, if any, need to be made to re-orient the beam relative to the wafer surface and features formed thereon to adequately mitigate the amount of shadowing. The implantation angle can be adjusted, for example, to bring the degree of shadowing to within some predefined tolerances or ranges based upon, for instance, the types of semiconductor devices being fabricated and performance specifications and acceptable failure rates, etc. for those devices.

At 910, crystal cut error data is obtained regarding the variation between the nominal crystalline lattice structure and the actual crystalline lattice structure and the mechanical surface of the wafer. This data may be obtained from any of a variety of sources, such as a wafer supplier, or a separate or standalone tool, or the same or different implantation system that can perform one or more measurements that detail the orientation of the silicon crystal lattice relative to the mechanical surface of the wafer (e.g., via Rutherford backscattering, x-ray diffraction, crystallography, etc.).

It will be appreciated that this crystal lattice data may only have to be obtained periodically throughout a fabrication process since multiple wafers that are cut at the same orientation/angle from a single boule are likely to have similar, if not identical, lattice structures relative to their respective mechanical surfaces. Obtaining this data more frequently may, however, improve alignment as there may be some drift from wafer to wafer. For example, lattice variations may result where the boule is warped or otherwise irregularly shaped, or where one or more of the settings of the instrument utilized to cut the wafers from the boule drifts. New crystal lattice data should also be obtained whenever new wafers originate from different boules since lattice structures can differ from boule to boule. Similarly, updated data should also be directed to the system whenever wafers are cut from the same boule, but at substantially different angles or orientations (e.g., to obtain wafers of different dimensions).

At 912, the severity of any expected channeling is determined given the orientation of the ion beam relative to the crystal lattice structure of the wafer (as provided by the wafer cut error data). Then, at 914 what adjustments, if any, that may need to be made to re-orient the beam relative to the crystalline lattice structure of the wafer to achieve a desired amount of channeling are ascertained. At 916, the proposed shadowing and channeling adjustments are then compared to see if they coincide. If they do not (e.g., either the shadowing mitigation adjustments affect channeling too much, or the channeling adjustments do not adequately address, or even exaggerate, shadowing), then at 918 iterative calculations can be made to ascertain an acceptable adjustment angle.

An acceptable or "best fit" beam to wafer orientation can be arrived at, for example, by considering the respective effects that different degrees of channeling and shadowing can have on reliability, failure rates, and/or other performance criteria of the devices being fabricated. These effects can then be compared to acceptable levels to determine their importance. As such, weights can be assigned to channeling effects, shadowing effects, etc. given the types of devices being fabricated and the desired operation of such devices. Additionally, feature data may include, for example, an allowable range of correction to simplify complex calculations dealing with different devices formed on the wafer that have different sensitivities, structures that may have unique, abnormal (e.g., asymmetrical) dimensions, features or devices that have varying heights, etc.

Interpolation can also, for example, be utilized in arriving at a satisfactory implant angle in conjunction with one or more data stores that correlate, among other things, acceptability/unacceptability of certain levels of channeling and/or shadowing given particular product performance parameters, failure rate tolerances, etc., as well as various degrees of channeling and/or shadowing as a function of crystal cut data, spacing and feature data, implantation angle data, etc. Technologies associated with facilitating unconstrained optimization (e.g., back-propagation, Bayesian, Fuzzy Set, Non Linear regression, or other neural network paradigms including mixture of experts, cerebellar model arithmetic computer (CMACS), Radial Basis Functions, directed search networks, and functional link nets) can also be implemented in arriving at a desirable angle of implantation.

The methodology then advances to 920 where the implantation process is adjusted as is appropriate. It will be appreciated that the best (e.g., least expensive, least complex, most efficient) manner to adjust the relative orientation between the beam and wafer surface may be determined. By way of example only, and not limitation, if a single wafer is mounted on a wafer support for doping, then one or more components within a beamline assembly may be selectively controlled to adjust the angle of implantation. If, on the other hand, multiple wafers are mounted on the wafer support, then one or more components of both the beamline assembly and an end station can, for example, be selectively adjusted to achieve a desired implantation result. Alternatively, one or more components of only the end station may, for example, be selectively adjusted to (re)orient a workpiece relative to the beam. It will be appreciated that if the shadowing mitigation and channeling mitigation adjustments are found to be in agreement at 916, then the methodology simply advances to 920. The methodology can then proceed on for further processing.

Thus, according to one or more aspects of the present invention, a measurement of crystal cut error can be fed forward to one or more different implant stages and utilized thereby to adapt the implantation process to achieve desired doping (e.g., concurrent mitigation of channeling and shadowing). Obtaining the crystal cut data and utilizing the same to adjust different stages and/or ion implanters may be a more efficient and inexpensive manner to account for crystal cut error than conventional (in-situ) measurements, which may have to be performed at multiple implant stages and/or on multiple ion implanters. In particular, in-situ techniques generally increase costs associated with ion implantation systems since additional hardware and/or controls may have to be present at multiple implant stages or systems. Additionally, redundant measurements may unnecessarily be taken with in-situ techniques since wafers often matriculate through the same ion implanters or implantation stages multiple times during semiconductor fabrication. Associating crystal lattice orientation data with a particular wafer and iteratively feeding this data forward to the relevant ion implantation systems and/or stages as the wafer matriculates through the fabrication process can virtually eliminate such redundant measurements and associated costs and inefficiencies.

Utilizing the data to adjust the angle of incidence of an ion beam relative to a wafer, and more particularly to the crystalline lattice structure of a silicon wafer, in accordance with one or more aspects of the present invention also facilitates process repeatability. For example, repositioning a wafer relative to an ion beam based upon crystal cut error can yield more accurate alignment of the ion beam relative to the silicon wafer. In the case of a batch implanter, for example, where individual wafer repositioning is more difficult, beam alignment error can be minimized for a group of wafers. One or more wafers can also be reoriented within some limits, such as may be governed, at least in part, by feature dimensions, which can contribute to shadowing effects. In situations where channeling is not a concern the ion beam may, for example, be oriented such that reduction of shadowing effects is of primary import.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means example.

What is claimed is:

1. An ion implantation system comprising:
   an ion source for generating ions;
   a beamline assembly for generating an ion beam from the ions generated by the ion source and directing the ions along a path of travel;
   an endstation for positioning a workpiece relative to the path of travel so that ions traveling in the ion beam impact the workpiece at select locations; and
   a processor that assists with obtaining implantation data relevant to determining a relative orientation between the ion beam and the surface of the workpiece to be impacted thereby.

2. The system of claim 1, wherein the implantation data includes data relating to the orientation of the mechanical surface of the workpiece relative to the ion beam directed at the surface of the workpiece to implant ions within select locations of the workpiece.

3. The system of claim 2, wherein the implantation data includes data regarding one or more features formed upon the surface of the workpiece, including respective spacings existing between the features, the processor determining respective degrees of shading likely to result during ion implantation given the orientation data and the feature data, and what adjustments, if any, should be made to the relative orientation between the ion beam and the surface of the workpiece to adequately mitigate shading.

4. The system of claim 2, wherein the implantation data includes cut error data relating to a relative orientation between the surface of the workpiece and a lattice structure of the workpiece, the processor determining the severity of channeling likely to result from the ion implantation given the orientation data and the cut data, and what adjustments, if any, should be made to the relative orientation between the ion bean and the surface of the workpiece to adequately mitigate channeling.

5. The system of claim 3, wherein the implantation data further includes cut error data relating to a relative orientation between the surface of the workpiece and a lattice structure of the workpiece, the processor also determining the severity of channeling likely to result from the ion implantation given the orientation data and the cut data, and what adjustments, if any, should be made to the relative orientation between the ion bean and the surface of the workpiece to adequately mitigate channeling.

6. The system of claim 5, wherein, to determine what adjustments, if any, should be made to the relative orientation between the ion bean and the surface of the workpiece to adequately mitigate shading and channeling, the processor also considers respective effects that different degrees of channeling and shadowing can have on predefined performance criteria;

compares these effects to predefined acceptable levels; and assigns a weight to the different degrees of channeling and shadowing based upon the severity of the respective effects and the acceptable levels.

7. The system of claim 3, wherein the feature data includes a width of one or more of the features.

8. The system of claim 4, wherein the cut error data is obtained utilizing at least one of Rutherford backscattering, x-ray diffraction and crystallography.

* * * * *

UNITED STATES PATENT AND TRADEMARK OFFICE
CERTIFICATE OF CORRECTION

PATENT NO.    : 6,940,079 B2
DATED         : September 6, 2005
INVENTOR(S)   : Andrew M. Ray It is certified that error appears in the above-identified patent and that said Letters Patent is hereby corrected as shown below:

Column 16,
Lines 29-40, replace claim 1 with the following:
-- 1.   An ion implantation system comprising:
   an ion source for generating ions;
   a beamline assembly for generating an ion beam from the ions generated by the ion source and directing the ions along a path of travel;
   an endstation for positioning a workpiece relative to the path of travel so that ions traveling in the ion beam impact the workpiece at select locations; and
   a processor that assists with obtaining implantation data relevant to determining a relative orientation between the ion beam and the surface of the workpiece to be impacted thereby, wherein the implantation data includes cut error data relating to a relative orientation between the surface of the workpiece and a lattice structure of the workpiece. --.

Lines 55-63, replace claim 4 with the following:
-- 4.   The system of claim 2, wherein the processor is further configured to determine a severity of channeling likely to result from the ion implantation given the orientation data and the cut error data, and
what adjustments, if any, should be made to the relative orientation between the ion beam and the surface of the workpiece to adequately mitigate channeling.

UNITED STATES PATENT AND TRADEMARK OFFICE
CERTIFICATE OF CORRECTION

PATENT NO. : 6,940,079 B2
DATED : September 6, 2005
INVENTOR(S) : Andrew M. Ray

It is certified that error appears in the above-identified patent and that said Letters Patent is hereby corrected as shown below:

<u>Column 16, line 64 - Column 17, line 5,</u>
Replace claim 5 with the following:
-- 5.  The system of claim 3, wherein the processor is further configured to determine a severity of channeling likely to result from the ion implantation given the orientation data and the cut error data, and what adjustments, if any, should be made to the relative orientation between the ion beam and the surface of the workpiece to adequately mitigate channeling. --.

Signed and Sealed this

Twenty-eighth Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,940,079 B2
APPLICATION NO. : 11/006840
DATED : September 6, 2005
INVENTOR(S) : Andrew M. Ray It is certified that error appears in the above-identified patent and that said Letters Patent is hereby corrected as shown below:

Column 16,
Lines 29-40, replace with the following:

-- 1. An ion implantation system comprising:
   an ion source for generating ions;
   a beamline assembly for generating an ion beam from the ions generated by the ion source and directing the ions along a path of travel;
   an endstation for positioning a workpiece relative to the path of travel so that ions traveling in the ion beam impact the workpiece at select locations; and
   a processor that assists with obtaining implantation data relevant to determining a relative orientation between the ion beam and the surface of the workpiece to be impacted thereby, wherein the implantation data includes cut error data relating to a relative orientation between the surface of the workpiece and a lattice structure of the workpiece. --.

Lines 55-63, replace with the following:

-- 4. The system of claim 2, wherein the processor is further configured to determine a severity of channeling likely to result from the ion implantation given the orientation data and the cut error data, and what adjustments, if any, should be made to the relative orientation between the ion beam and the surface of the workpiece to adequately mitigate channeling. --.

UNITED STATES PATENT AND TRADEMARK OFFICE
CERTIFICATE OF CORRECTION

PATENT NO. : 6,940,079 B2
APPLICATION NO. : 11/006840
DATED : September 6, 2005
INVENTOR(S) : Andrew M. Ray It is certified that error appears in the above-identified patent and that said Letters Patent is hereby corrected as shown below:

Column 16, line 64 through Column 17, line 5, replace with the following:

-- 5. The system of claim 3, wherein the processor is further configured to determine a severity of channeling likely to result from the ion implantation given the orientation data and the cut error data, and what adjustments, if any, should be made to the relative orientation between the ion beam and the surface of the workpiece to adequately mitigate channeling. --.

Signed and Sealed this

Twentieth Day of June, 2006

JON W. DUDAS
*Director of the United States Patent and Trademark Office*